US010264710B2

(12) United States Patent
Penttinen

(10) Patent No.: US 10,264,710 B2
(45) Date of Patent: Apr. 16, 2019

(54) THERMAL MATERIAL WITHIN A DEVICE

(71) Applicant: Microsoft Technology Licensing, LLC, Redmond, WA (US)

(72) Inventor: Juha Erkki Antero Penttinen, Salo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/831,464

(22) Filed: Aug. 20, 2015

(65) Prior Publication Data

US 2017/0055374 A1   Feb. 23, 2017

(51) Int. Cl.
*H05K 7/20* (2006.01)
*G06F 1/20* (2006.01)
*H05K 3/28* (2006.01)
*H05K 3/00* (2006.01)
*H05K 3/30* (2006.01)
*H05K 1/02* (2006.01)

(52) U.S. Cl.
CPC ......... *H05K 7/20436* (2013.01); *G06F 1/203* (2013.01); *H05K 1/0209* (2013.01); *H05K 3/0091* (2013.01); *H05K 3/284* (2013.01); *H05K 3/303* (2013.01); *H05K 1/0204* (2013.01); *H05K 3/285* (2013.01); *H05K 2201/0162* (2013.01); *H05K 2201/0715* (2013.01); *H05K 2201/09872* (2013.01); *H05K 2203/1316* (2013.01)

(58) Field of Classification Search
CPC ..... H01L 23/42; H01L 23/373; H05K 1/0203; H05K 7/2039
See application file for complete search history.

(56) References Cited

U.S. PATENT DOCUMENTS

| 5,208,733 | A |   | 5/1993  | Besanger |
|-----------|---|---|---------|----------|
| 5,519,585 | A |   | 5/1996  | Jones et al. |
| 5,550,711 | A | * | 8/1996  | Burns ................... H01L 21/565 257/787 |
| 7,623,349 | B2 | * | 11/2009 | Refai-Ahmed ...... H05K 1/0203 174/252 |

(Continued)

FOREIGN PATENT DOCUMENTS

| CN | 203661406 U    | 6/2014 |
| KR | 20060036433 A  | 4/2006 |
| WO | 2014114415 A1  | 7/2014 |

OTHER PUBLICATIONS

"Cure-in-Place Potting and Underfill Materials", May 21, 2015 Available at: http://vendor.parker.com/852568C80043FA7A/ 468ea5de5ac341d385257d39005641c7/ 7EC4C2A1C758B58A852569580073DD5C/$FILE/THERM-A-FORM_1.pdf.

(Continued)

*Primary Examiner* — Robert J Hoffberg
*Assistant Examiner* — Hung Dang

(57) ABSTRACT

In an embodiment, thermal conductive material within a device having electrical component is described. In an embodiment, a device is disclosed comprising: a printed circuit board comprising electrical components; a housing of the device, wherein the housing substantially encloses the printed circuit board; a thermal conductive material coated on the printed circuit board, wherein the thermal conductive material is configured to coat an interface between an electrical component and the printed circuit board, and wherein the thermal conductive material is located between the printed circuit board and a portion of the housing according to both a three dimensional topography of the printed circuit board and a three dimensional shape of the portion of the housing.

20 Claims, 12 Drawing Sheets

(56) References Cited

U.S. PATENT DOCUMENTS

| | | | |
|---|---|---|---|
| 8,199,506 B2 | 6/2012 | Janik et al. | |
| 8,555,493 B2 | 10/2013 | Xu et al. | |
| 8,770,802 B2 * | 7/2014 | Nall | F21V 29/004 |
| | | | 362/249.02 |
| 8,913,390 B2 | 12/2014 | Malek et al. | |
| 8,921,993 B2 | 12/2014 | Choi et al. | |
| 8,952,272 B2 | 2/2015 | Malek et al. | |
| 2006/0198108 A1 | 9/2006 | Refai-Ahmed et al. | |
| 2009/0091888 A1 | 4/2009 | Lin et al. | |
| 2009/0242263 A1 | 10/2009 | Kapusta et al. | |
| 2014/0043754 A1 | 2/2014 | Hartmann et al. | |
| 2014/0268780 A1 | 9/2014 | Wang et al. | |
| 2014/0326483 A1 | 11/2014 | DeVarney | |
| 2014/0355218 A1 | 12/2014 | Vinciarelli et al. | |
| 2015/0104630 A1 | 4/2015 | Moon et al. | |

OTHER PUBLICATIONS

"International Search Report and Written Opinion Issued in PCT Application No. PCT/US2016/043797", dated Oct. 11, 2016, 11 Pages.

"Second Written Opinion Issued in PCT Application No. PCT/US2016/043797", dated Aug. 2, 2017, 8 Pages.

"International Preliminary Report on Patentability Issued in PCT Application No. PCT/US2016/043797", dated Nov. 16, 2017, 9 Pages.

ACC Silicones Europe, "Thermally Conductive Silicone Encapsulants," Retrieved at: <<https://acc-silicones.com/products/encapsulants/thermally-conductive-silicone-encapsulants>>, on Feb. 6, 2019, 4 pages.

Kuayue, "Stable Thermal Conductive Sealant, AB Thermal Conductive Silicone Glue," Retrieved at: <<https://www.thermalconductivepad.com/sale-11184677-stable-thermal-conductive-sealant-ab-thermal-conductive-silicone-glue.html>>, on Feb. 6, 2019, 4 pages.

Epoxies Innovative Bonding Solutions, Etc., "Thermally Conductive Adhesives and Potting Compounds," Retrieved at: <<https://www.epoxies.com/products/thermally-conductive/>>, on Feb. 6, 2019, 4 pages.

Ziitek, "−40° C. to +130° C. Potting Coils Epoxy Thermally Conductive Glue, Excellent Insulation Heat Conducting Glue 2.5 W/m-K," Retrieved at: <<http://www.thermalconductivematerials.com/sale-6563533-potting-coils-thermally-conductive-epoxy-glue-excellent-insulation-heat-conducting-glue.html>>, on Feb. 6, 2019, 3 pages.

* cited by examiner

THERMAL MATERIAL WITHIN A DEVICE

BACKGROUND

Different types of electrical devices may have various electrical components. The electrical components are located inside a housing of the device, typically on a printed circuit board (PCB) of the device, between the PCB and a cover. Electrical components may generate heat, and temperature may have an effect on an operation of the electrical components and on the device. Furthermore, certain electrical components may emit electromagnetic radiation.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

In an embodiment, thermal conductive material within a device having electrical component is described. In an embodiment, a device is disclosed comprising: a printed circuit board comprising electrical components; a housing of the device, wherein the housing substantially encloses the printed circuit board; a thermal conductive material coated on the printed circuit board, wherein the thermal conductive material is configured to coat an interface between an electrical component and the printed circuit board, and wherein the thermal conductive material is located between the printed circuit board and a portion of the housing according to both a three dimensional topography of the printed circuit board and a three dimensional shape of the portion of the housing.

Other embodiments relate to a mobile device and a manufacturing method.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the present embodiments and is not intended to represent the only forms in which the present embodiment may be constructed or utilized. However, the same or equivalent functions and sequences may be accomplished by different embodiments.

Although the present embodiments may be described and illustrated herein as being implemented in a smartphone or a mobile phone, these are only examples having a thermal conductive material on the PCB and not a limitation. The present embodiments are suitable for application in a variety of different types of devices, for example, in tablets, phablets, computers, cameras, game consoles, small laptop computers, smart watches, wearable devices or any other device that has a need for and/or may benefit from a thermal management of the electrical components.

Figure 1:
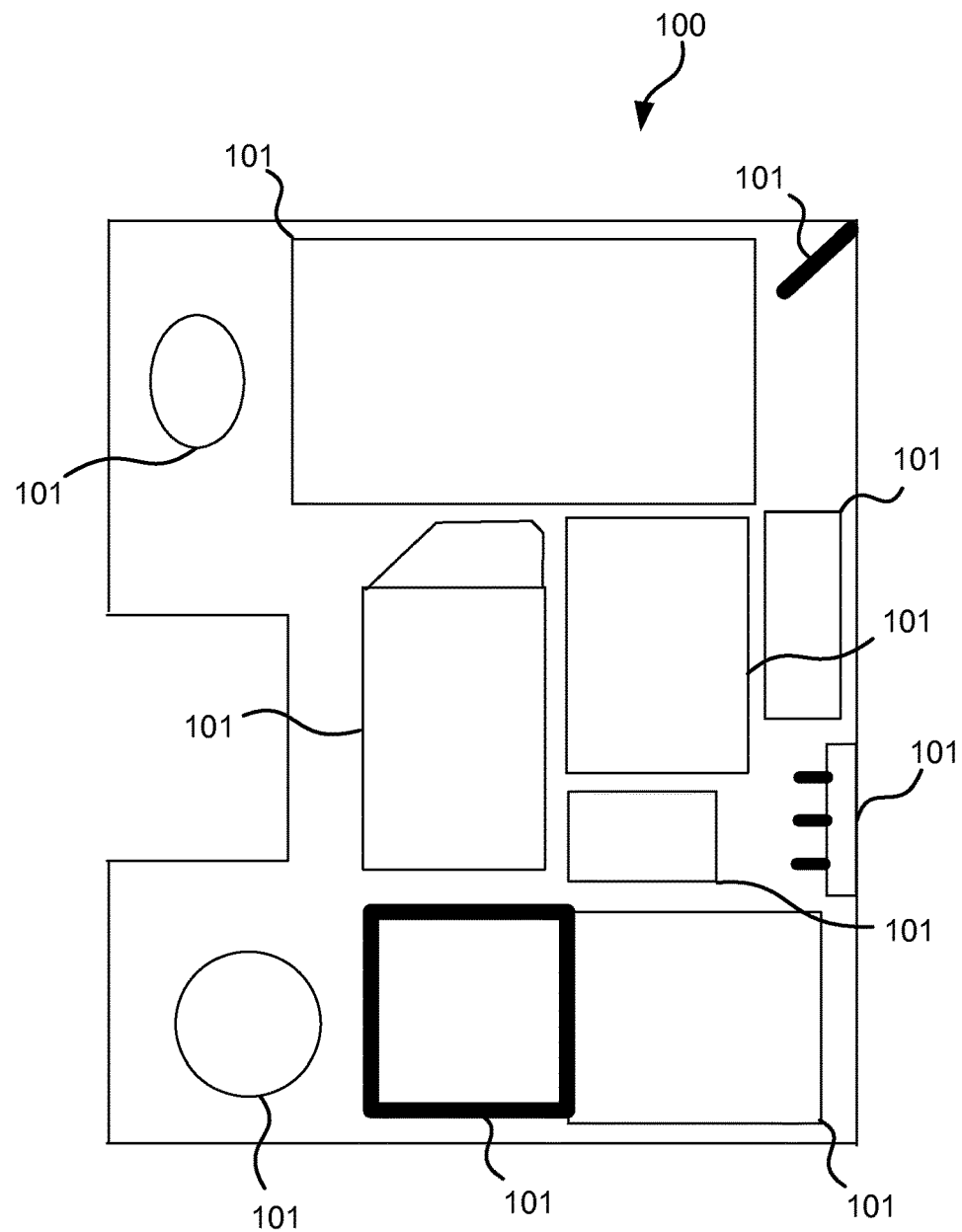
FIG. 1 illustrates a schematic representation of a PCB of a device comprising various electrical components according to an embodiment.

FIG. 1 illustrates a schematic representation of a PCB 100 of a mobile device having various electrical components 101 according to an embodiment. The electrical components 101 are shown in FIG. 1 without a thermal conductive material. FIG. 1 illustrates one side of the PCB 100, for example a top of the PCB 100.

An embodiment is directed to a mobile device that includes a PCB 100 assembly with electrical components 101. Although the present embodiment comprises the printed circuit board 100 (PCB), it is for illustrative purposes only and not intended as a limitation of the possible implementations of the disclosed subject matter. According to an embodiment the PCB 105 may include various structures that may mechanically support and/or electrically connect electric and electronic components, for example, Printed Wire Board (PWB), Printed Circuit Assembly (PCA), Printed Circuit Board Assembly (PCBA), Circuit Card Assembly (CCA), Flexible Printed Circuit (FPC), etc. Referring to an embodiment as illustrated in FIG. 1, PCB 100 may be a substrate to which various electronic and electrical components 101 of a mobile device are attached. These components may be, for example, camera modules, microphones, LEDs, sensors, etc. which are exposed to the exterior through the cover. The components 101 may also be, for example, processors, GPUs, digital signal processors, USB ports, connectivity ports, charging ports etc., which are either hidden or partially exposed to the exterior through a cover or sides of a device.

Figure 2:
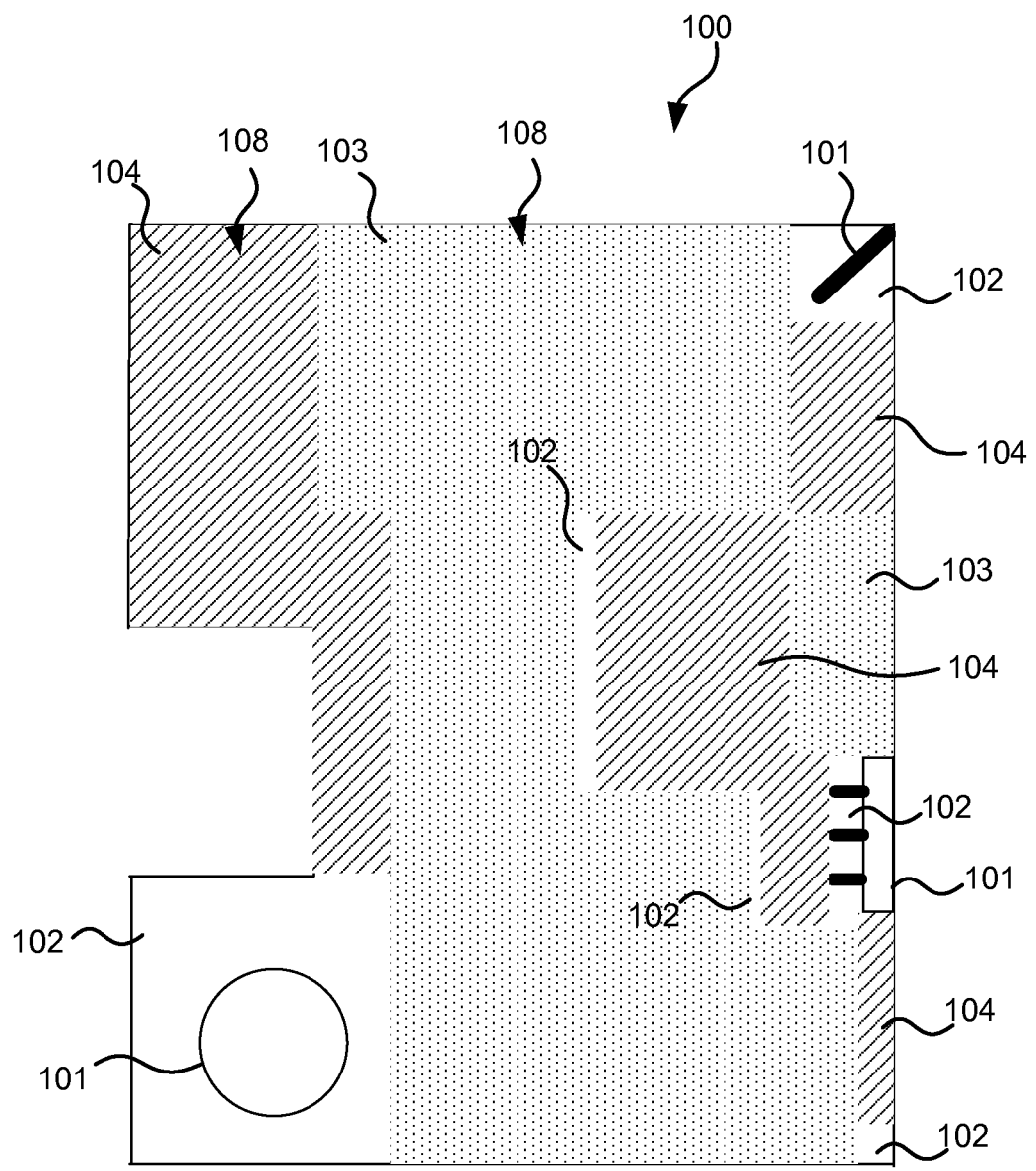
FIG. 2 illustrates a schematic representation of the PCB wherein thermal conductive material is configured on the PCB according to an embodiment.

Electrical components 101 may generate (undesired) heat. The temperature may have an effect on an operation of the electrical components 101, and consequently on an operation of the entire mobile device. Typically, the device may operate better at cooler temperatures. For example, CPU performance may be dependent on a temperature having better performance at lower temperatures than at higher temperatures. Furthermore, certain electrical components 101 may emit electromagnetic radiation (EMI) or radio frequency interference (RFI) signals. Furthermore, physical size and a space within the mobile device may be limited and restricted, as device may be relatively small and compact. Furthermore, the performance of the components 101 configured on PCB 100 may need to be high enough to meet the standardization requirements and complexity of the mobile device. Higher performance may lead to generation of more unwanted heat. Consequently, any free space within the housing or the cover of the device may be limited and the amount of unwanted heat generated within the device may be high FIG. 2 illustrates a schematic representation of the PCB 100 wherein thermal conductive material 108 is configured on the PCB 100 according to an embodiment. The embodiment is directed to a mobile device that includes a PCB 100 assembly with electrical components 101 and a thermal conductive material 108 (also referred to as a "thermal interface material") that conducts heat away from the electrical components 101 of the PCB 100 assembly.

Thermal conductive material 108 may be disposed, for example coated, on certain portions 103,104 of the PCB 100. The first portion 103 (shown by dotted areas) on the PCB 100 may, for example, comprise a thickness of 0.2 mm. The second portion 104 (shown by lined area) on the PCB 100 may, for example, comprise a thickness of 1.8 mm. There may be several different portions having various different thicknesses, and the two portions 103,104 with their respective thicknesses are shown for illustration purposes only. Coating may be done with thermal conductive material 108, whose resistance may, for example, be $10^{12}$ ohms. Thermal conductive material 108 may be highly electrically non-conductive. Thermal conductive material 108 may, for example, comprise silicon having aluminum oxide particles or aluminum nitride particles. The coating may be configured based on a topography of the electrical components 101 on the PCB 100. Different portions of thermal conductive material 108 may follow the topography of the electrical components 101 on the PCB 100. The thermally conductive material 108 may be disposed between the PCB 100 assembly and the cover or the housing of the device. Consequently, the thickness of the different portions of thermally conductive material may depend on an available space between the components 101 and the cover. For example, in the portions of the PCB 100 where a height of the components 101 in a direction of Z-axis is high, for example portion 103, the thickness of the thermal conductive material 108 may be small. For another example, in the portions of the PCB 100 where a height of the components 101 in a direction of Z-axis is low, for example the portion 104, the thickness of the thermal conductive material 108 is large. Some portions of the PCB 100, for example portions 102, may not comprise (a coating of) the thermal conductive material 108. Such portions 102, may include areas where there are electrical components like antenna contact clips, BTB (board-to-board) connector, AV jacket and all electrical connection pins etc. Uncoated portions 102 may be maintained open by a molding tool design.

Thermal conductive material 108 may conduct heat away from the electrical components 101 and the PCB 100. It may improve a device's thermal management capability by increasing the heat sink capacity. In addition to conducting heat away from the electrical components 101 of the PCB 100, the thermally conductive material 108 may act as a shock protector. The thermally conductive material 108 may help mitigate or even prevent damage to the PCB 100 assembly that may result from the application of a shock to the device. Furthermore, thermal conductive material 108 may be configured to act as a moisture barrier, and improve moisture resistance and/or waterproof capability for the PCB 100. According to an embodiment, thermal conductive material 108 comprises silicon having particles. The silicon permits the thermal conductive material 108 to provide moisture resistance, and may protect the electrical components 101 and the PCB 100 from moisture. Furthermore, the heat sinking capability of the thermal conductive material 108 may correlate to its thickness. A thicker coat of the thermal conductive material 108 may have a higher heat sinking capability.

Figure 3:
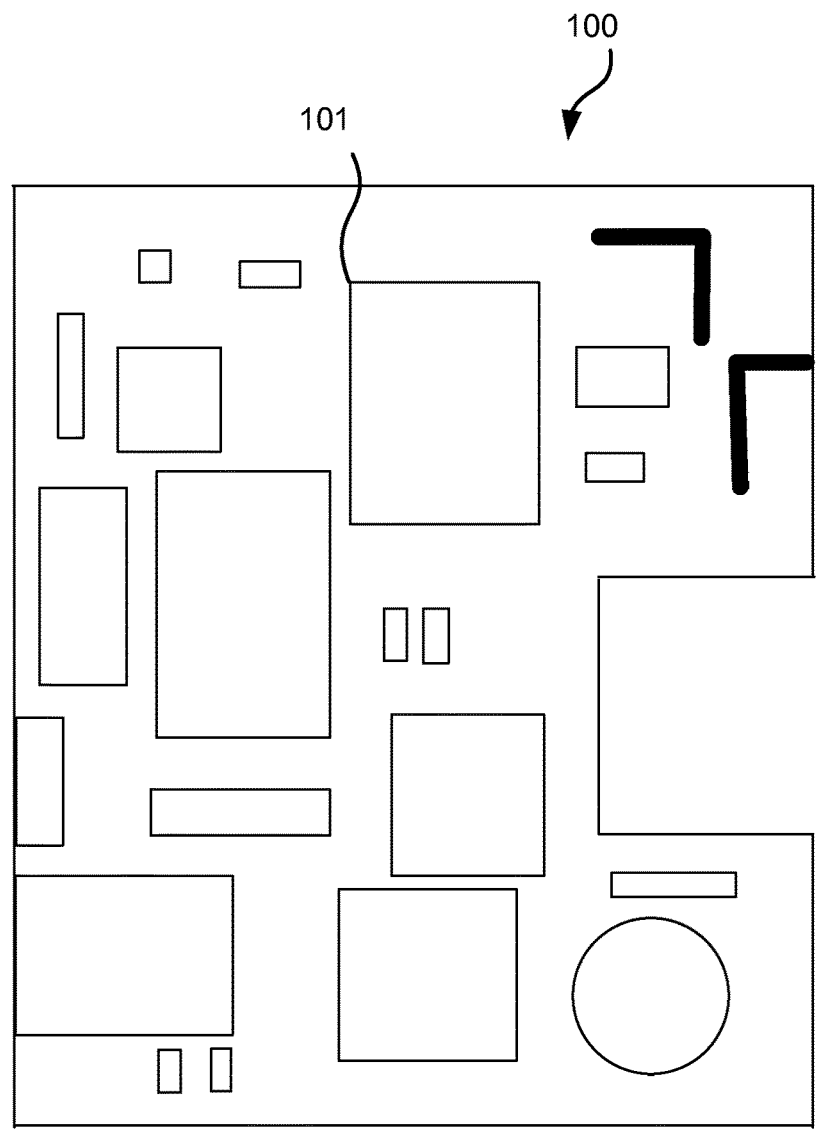
FIG. 3 illustrates a schematic representation of a backside of the PCB showing various electrical components according to an embodiment.
Figure 4:
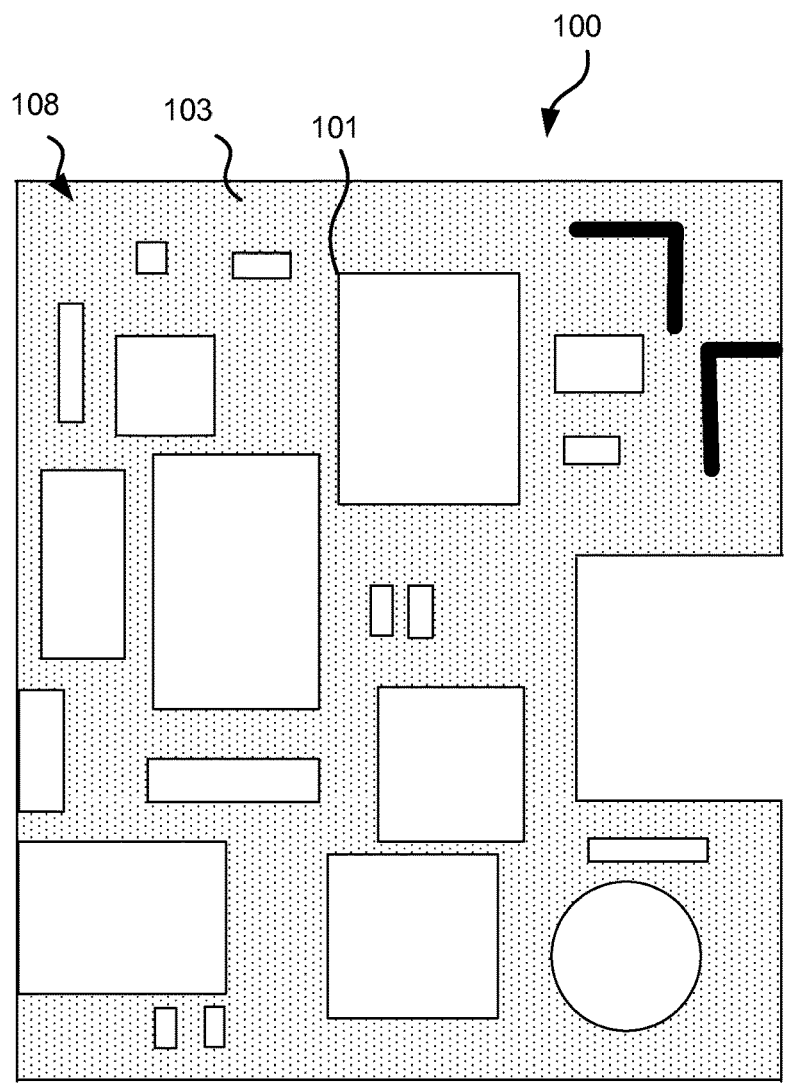
FIG. 4 illustrates a schematic representation of the backside of the PCB wherein thermal conductive material is configured on the back of the PCB according to an embodiment.

FIG. 3 and FIG. 4 illustrate a schematic representation of a backside of the PCB 100. In FIG. 3 electrical components 101 of the backside are shown, according to an embodiment. In FIG. 4 thermal conductive material 108 is configured on the backside, according to an embodiment.

According to an embodiment, the whole PCB 100 may be encapsulated by thermal conductive material 108. For example, the PCB 100 is molded so that a top (illustrated in FIGS. 1 and 2), a back (illustrated in FIGS. 3 and 4) and edges are, at least partly, enclosed with thermal conductive material 108. For the backside, thermal conductive material 108 may also be configured based on the topography of the electrical components 101 on the PCB 100. According to an embodiment, this may be done for the both sides of the PCB 100. An embodiment of FIG. 4 comprises only a portion 103 of the thermal conductive material. It should be noted that there may be various different kind of portions having different thicknesses of thermal conductive material 108. This may be based on the topography of the electrical components 101 and on available space between the components 101 and the cover or housing of the device.

According to an embodiment, because the backside of the PCB 100, and possibly the edges of the PCB 100, is/are also covered by thermal conductive material 108, PCB 100 may be more thoroughly covered and encapsulated by thermal conductive material 108. Enhanced heat management may be achieved. The degree of enhancement in heat management may depend on the topography, available space between the cover and the components 101, and thickness of thermal conductive material.

Figure 5:
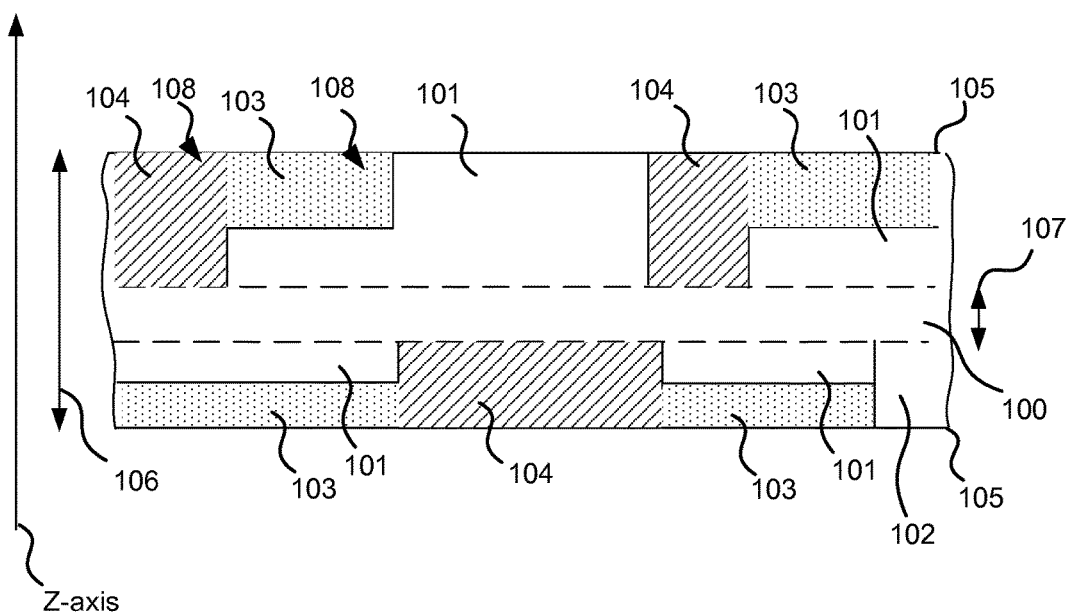
FIG. 5 illustrates a schematic representation of a cross-section the device showing different thicknesses of thermal conductive material according to an embodiment.

FIG. 5 illustrates a schematic representation of a cross-section of the PCB 100. FIG. 5 shows various thicknesses of thermal conductive material 108 on the PCB 100 according to an embodiment.

An embodiment of FIG. 5 shows cross sections of the first 103 and the second 104 portions of thermal conductive material 108. Thermal conductive material 108 may be configured on the PCB 100 and/or on the component 101 having different heights. Also a portion 102 not having the thermal conductive material is shown in FIG. 5. FIG. 5 illustrates how thermal conductive material 108 is configured between the electrical component 101 (and the PCB 100) and the cover 105. Depending on the topography, for example a height of the electrical component 101 or portion of the PCB 100 that must have an access and no cover, and available space between the cover 105 and the component 101, material 108 is disposed. According to an embodiment a total height 106 of the device may be 4.1 mm-4.5 mm. According to an embodiment a thickness 107 of the PCB 100 may be 0.5 mm-0.7 mm. According to an embodiment, an available maximum total thicknesses (including both top and back parts) of thermal conductive material 108 may be 3.6 mm-3.8 mm. Thermal conductive material 108 conforms to a shape and dimensions of the available space, and consequently also conforms to the topography of the PCB 100 and the components 101.

According to an embodiment, the internal components of the device may be tightly packed and designed within the housing. For example the electrical components 101 and the PCB 100 are configured tightly inside the housing of the device. An available space inside the device is very limited. By managing the disposed thermal conductive material 108 according to the three dimensional topography of the components 101 and matching it to the available space inside the device, a thermal performance of the device may be improved. For example, the device may conduct better heat from the electrical components 101 towards exterior of the device, utilizing maximum available space for thermal conductive material. Consequently, an embodiment may utilize very limited space within the device for disposing the thermal conductive material 108 to that space. For example starting from thickness of 0 mm or 0.2 mm, up to the available height in z axis direction, which may be 1.8 mm on top of the PCB 100 (a total of 3.6 mm for both sides). Of course, the available space depends of the internal design of the device, and the given numerical values are merely one possible example. A maximum heat conductive increase may be achieved for the available internal design of the device. This may improve the electrical performance of the device. The thermal conductive material can accurately fit, with respect to a three dimensional topography, into the standardized industrial design of the electrical components 101 of the device within the housing.

Figure 6:
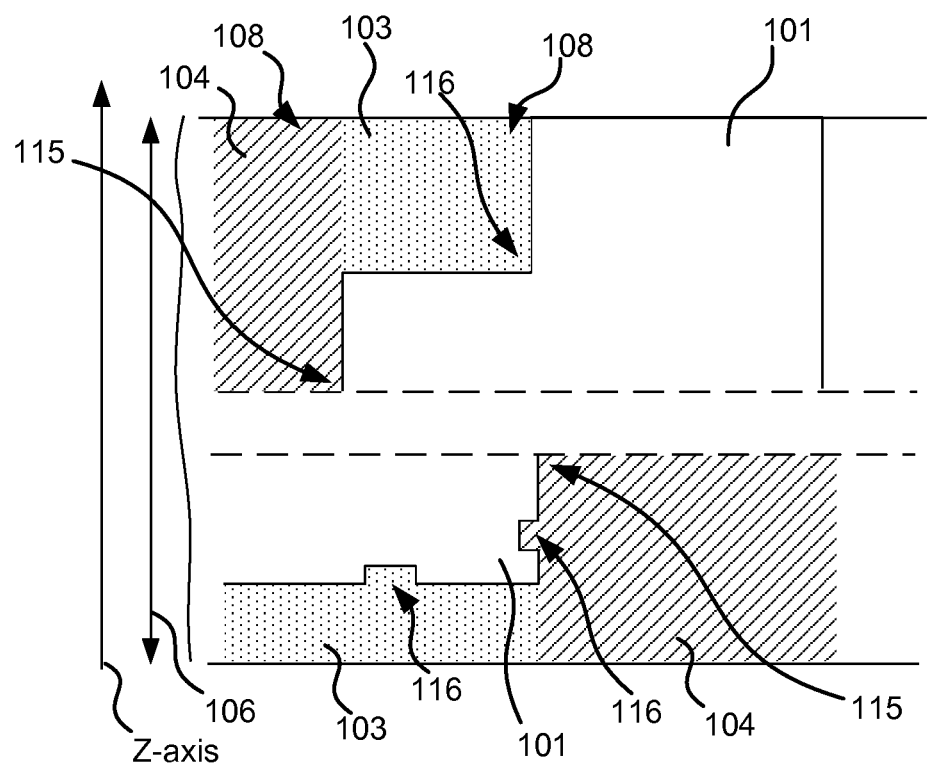
FIG. 6 illustrates a schematic representation of a cross-section the device showing thermal conductive material coated on an interface between an electrical component and PCB according to an embodiment.

FIG. 6 illustrates an embodiment having the thermal conductive material 108 is coated on an interface 115 between an electrical component 101 and PCB 100.

Thermal conductive material 108 may be configured accurately with respect to the shape and dimension of the electrical component 101 and the available space within the housing. Thermal conductive material 108 may conform to the shape of the electrical component 101. Thermal conductive material 108 can penetrate and conform to a shape 116 of the component 101, and respectively to an available space within the housing. For example, a penetration depth into 65 micron (0.065 mm) shapes, for example gaps, slots, openings, may be achieved. Thermal conductive material 108 can be coated on an interface 108 between the component 101 and the PCB 100. Consequently, thermal conductive material 108 can be coated on a location on the components 101, on the PCB 100, or within the housing that is difficult to coat, for example by a compression of the material. Thermal conductive material 108 can be flowingly configured and dispensed in a form of fluid, semi-fluid, gel, or paste so as to accurately conform to the available space within the housing.

According to an embodiment a better thermal conductivity may be achieved, for example when compared to compressing a sheet like elastic material on the PCB. This may enable more efficient performance for the device, for example due to the improved electronics performance. According to an embodiment a physical space inside the device may be very limited, whereby any available free space for this purpose counts. For example, a mobile phone may have very limited available space for thermal conductive material within the housing of the phone. Consequently, an accurate design with respect to the thermal conductive material 108 may be required. According to an embodiment, when the thermal conductive material 108 is configured on the interface 115, a tight protective measure for the electronics may be achieved. The material 108 coating the whole component 101 and on the interface 115 may seal or enclose the component 101 and the PCB 100. Furthermore, the material 108 may operate in electronic connections without the risk of short-circuit, because according to an embodiment the material 108 may be dielectric. Consequently, the material 108 may, possibly, use all the available space within the housing. Furthermore, because it is not necessary to compress thermal conductive material 108, when manufacturing or assembling the device, the material 108 does not cause a mechanical stress on the electronics components 101. The material 108 may support the components 101, because of the accurate configuration covering the whole component, including a vertical side of the component 101.

Figure 7:
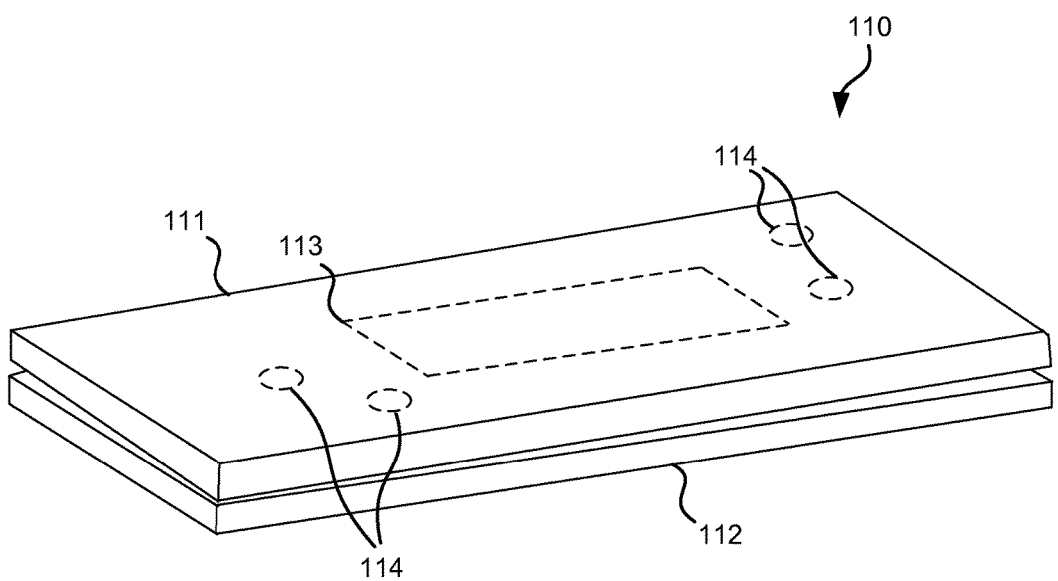
FIG. 7 illustrates a schematic representation of a molding tool configured to dispose the thermal conductive material on the PCB within the device according to an embodiment.

FIG. 7 illustrates a schematic representation of a molding tool 110 configured to dispose the thermal conductive material 108 on the PCB 100 within the cover 105 of the device according to an embodiment.

Insertion and configuration of thermal conductive material 108 may be performed by the molding tool 110. Molding tool 110 may comprise a top 111 and a bottom 112. Molding tool may comprise holes 114 for injecting or casting thermal conductive material 108 into the molding tool 110. Molding tool 110 may support the topography of the components 101 and the PCB 100, on both sides of the PCB 100. Consequently, different molding tools 110 may be configured for different PCBs. Furthermore, molding tool 110 may have a housing 113, which may be configured for the PCB 100 when it is inside the tool 110. For example, the housing 113 may hold the PCB 100 to an appropriate position within the tool 110, before the material 108 is inserted inside. The thermal conductive material 108 is formed by the process of moving a fluid of thermal conductive material 108 between the printed circuit board 100 and the housing. Thermal conductive material 108 may be in fluid, or semi-fluid, gel or a paste like state, when the casting is performed. Thermal conductive material 108 may be running or flowing, when it flows inside the tool 110. According to an embodiment, a viscosity of a gel like thermal conductive material may be 280 Pa-s (pascal-second), when it is flowing or running. Consequently, thermal conductive material 108 may be accurately configured according to both the three dimensional topography of the electrical components 101 and the three dimensional shape of the housing.

Thermal conductive material 108 may be cured in a molding tool 110. When the molding tool 110 is opened, PCB 100 may have been coated with thermal conductive material 108. Now the PCB 100 may proceed to the subsequent manufacturing procedure.

Figure 8:
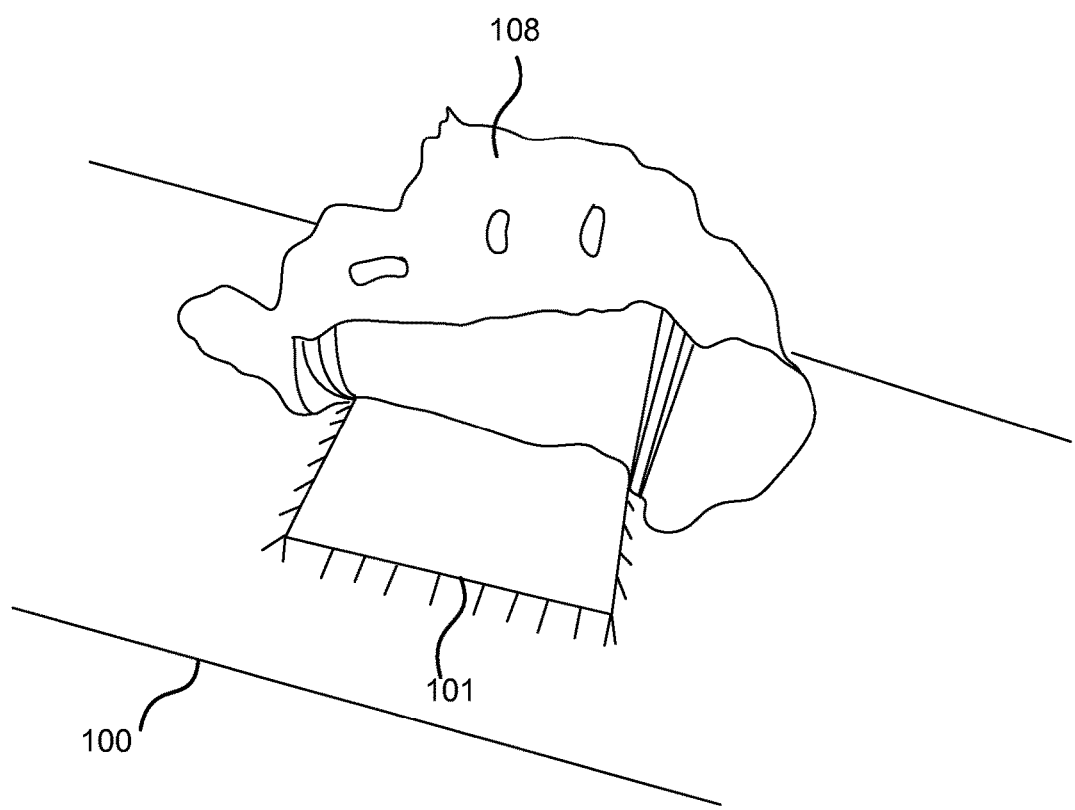
FIG. 8 illustrates a schematic representation of the thermal conductive material which may be reworked for repairing an electrical component under the original material according to an embodiment.

FIG. 8 illustrates a schematic representation of re-workability of thermal conductive material 108 according to an embodiment. Thermal conductive material 108 may be reworked for repairing an electrical component 101 under the thermal conductive material 108.

If it seems, for example in electrical testing, that there is a need to repair the PCB 100, thermal conductive material 100 can be removed, for example peeled off, at a PCB surface. Consequently after the thermal conductive material 108 has been removed, the PCB 100 or a component 101 configured on it may be repaired or replaced. After PCB 100 or a component 101 configured on it has been repaired or replaced, the coating process of the thermal conductive material 108 can be repeated for the new or repaired PCB 100.

Figure 9:
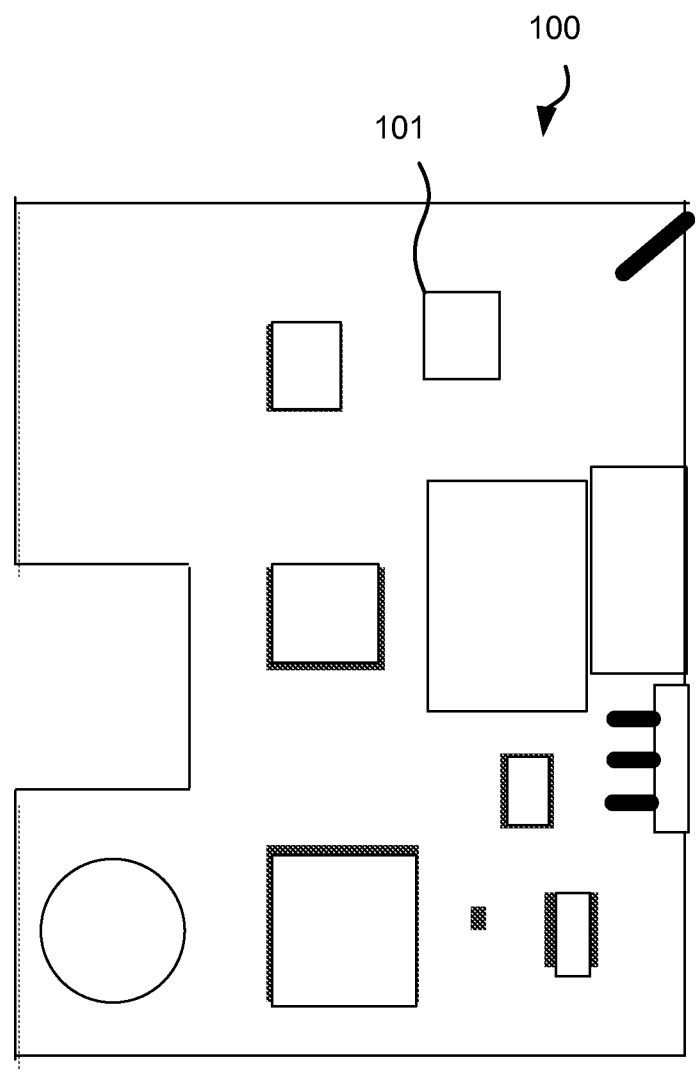
FIG. 9, FIG. 10 and FIG. 11 illustrate a schematic representation of a PCB of a device having thermal conductive material on the PCB and an EMI shielding on the material according to an embodiment.
Figure 10:
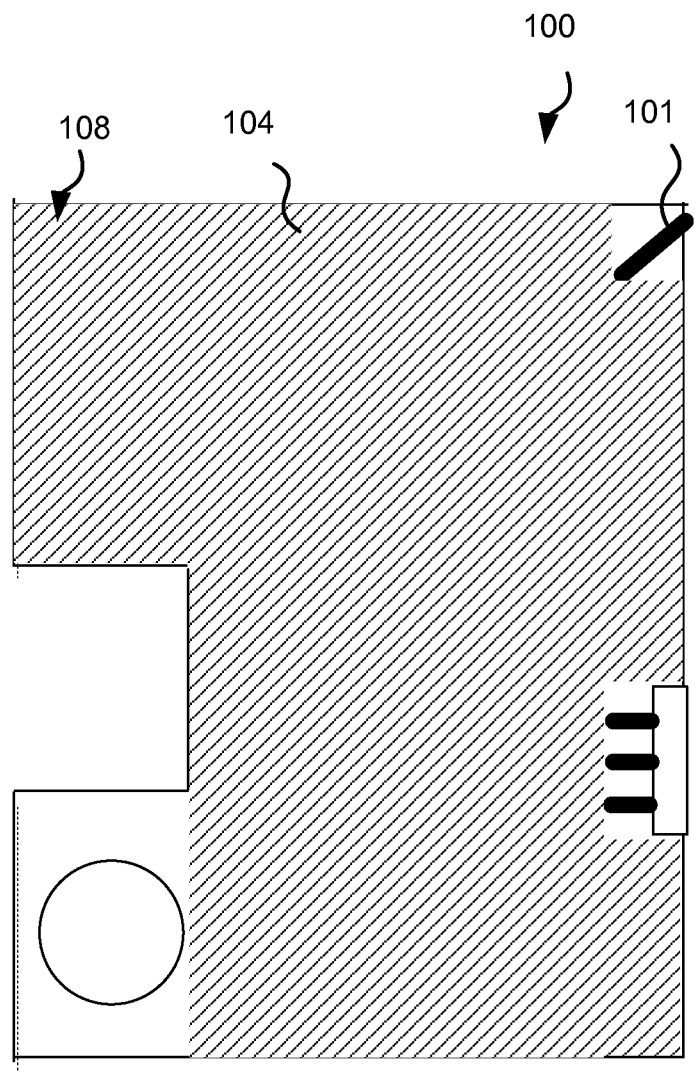
Figure 11:
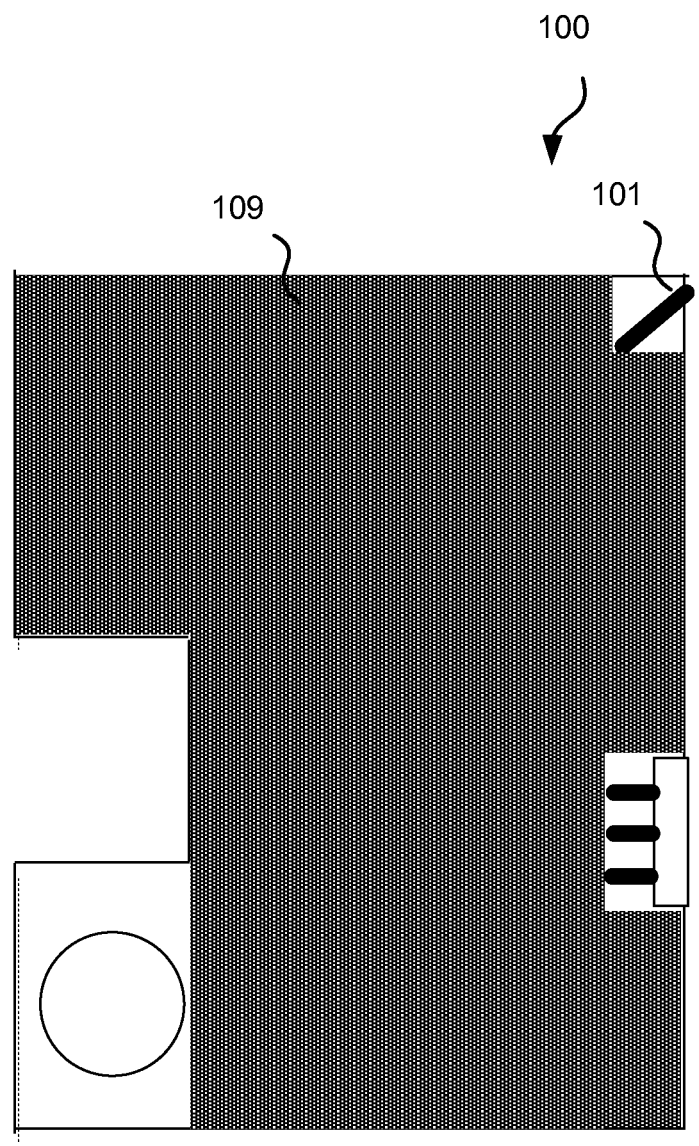

FIG. 9, FIG. 10 and FIG. 11 illustrate a schematic representation of a PCB 100 of a device having thermal conductive material 108 on the PCB 100 and an EMI shielding 109 on the thermal conductive material 108 according to an embodiment. FIG. 9 illustrates the PCB 100 without thermal conductive material or a shielding can or shielding cans for EMI shielding. FIG. 10 illustrates an embodiment of the thermal conductive material 108 that has been disposed on the PCB 100. FIG. 11 illustrates an embodiment of EMI shielding 109 (that may be alternatively referred to as RFI shielding).

In FIG. 11, EMI shielding 109 is performed over a portion 104 of the thermal conductive material. According to embodiments, EMI shielding 109 may be done with painting, spraying or using 3D printing a suitable shielding material onto the portion 104 of the thermal conductive material. According to embodiments, a shielding material may be copper or other electrically conductive material. According to an embodiment, traditional EMI shielding cans may be omitted, because the EMI shielding 109 may be disposed over the whole thermal conductive material 108 on the PCB 100. For example in the embodiment of FIG. 11 over the portion 104 as shown in FIG. 10.

Consequently, a simplified EMI shielding may be configured. Further, EMI shielding 109 may be better integrated into the manufacturing process.

The term 'computer', 'computing-based device', 'apparatus' or 'mobile apparatus' is used herein to refer to any device with processing capability such that it can execute instructions. Such processing capabilities are incorporated into many different devices.

Figure 12:
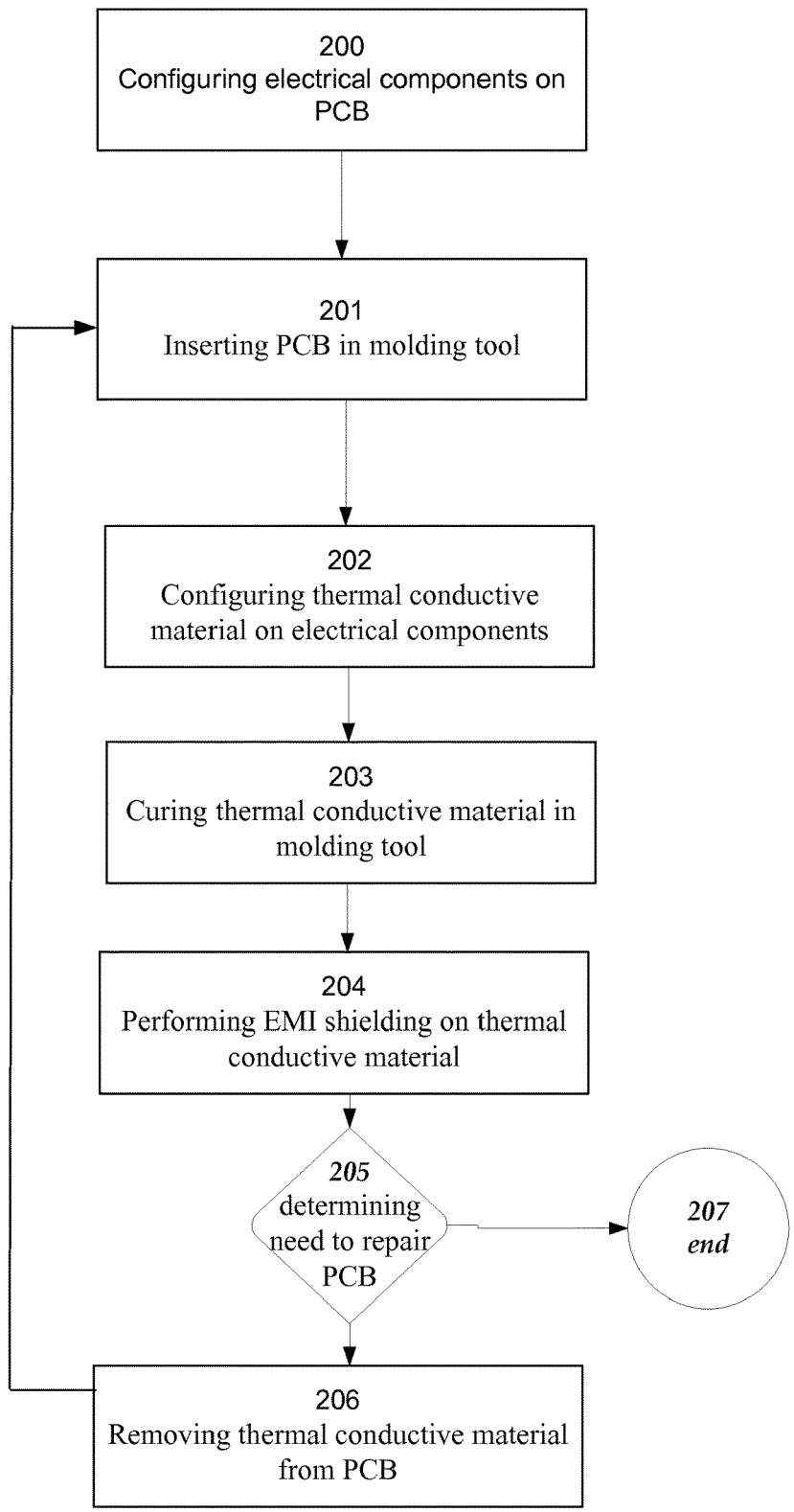
FIG. 12 illustrates a manufacturing process, in accordance with an illustrative embodiment.

An embodiment of a manufacturing process for manufacturing the PCB 100 is illustrated in FIG. 12.

According to an embodiment, a method comprises the following steps. In step 200, electrical components 101 are configured on a PCB 100. The PCB 100 may comprise various electrical components 101, which establish the topography of the components 101 on the PCB 100. In step 201, PCB 100 is inserted in a molding tool 110. The molding tool 110 encapsulates the PCB 100. Furthermore molding tool 100 places the PCB 100 in an appropriate position within the tool 110. In step 202, thermal conductive material 108 is flowingly configured on electrical components 101. Thermal conductive material 108 can be injected or casted into openings 114 of the molding tool 110. Thermal conductive material 108 flows inside the tool 110 so that appropriate portions of the PCB 100 may be coated by appropriate thickness of the material, and certain portions of the PCB 100 may not be coated. Both sides of the PCB 100 may be coated and the coating may follow the topography of the PCB 100 and a cover structure or the housing of the device. Top, back and edges of the PCB 100 may be enclosed by the material 108. The thermal conductive material 108 is formed by the process of moving a fluid of thermal conductive material 108 between the printed circuit board 100 and the housing. Thermal conductive material 108 may be in fluid, or semi-fluid, gel or a paste like state when the casting is performed. Thermal conductive material 108 may be running or flowing, when it flows inside the tool 110. According to an embodiment, a viscosity of a gel like thermal conductive material may be 280 Pa-s (pascal-second), when it is flowing or running. Consequently, thermal conductive material 108 can be accurately configured according to both the three dimensional topography of the electrical components 101 and the three dimensional shape of the housing. In step 203, thermal conductive material 108 may be cured in the molding tool 110. The conductive material 108 may solidify after it has been cured. After that the molding tool 110 may be opened. In step 204, EMI shielding 109 may be performed on the thermal conductive material 108. EMI shielding 109 may be painted or sprayed or printed on the material 108. In step 205, it is determined whether there is a need to repair the PCB 100. For example, testing may be performed in the manufacturing process, or a need for repair may occur after a long time has passed since manufacturing the PCB 100. In step 206, thermal conductive material 108 is removed from the PCB 100. If there is a need to repair the PCB 100, thermal conductive material 108 may be removed from the PCB 100. Now PCB 100 may be repaired or replaced. After PCB 100 has been repaired or replaced, the process returns to the step 201. The process ends in the step 207.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought, or without extending beyond the disclosure.

Any range or device value given herein may be extended or altered without losing the effect sought. Also any example may be combined to another example unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as embodiments of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term 'comprising' is used herein to mean including the method, blocks or elements identified, but that such blocks or elements do not comprise an exclusive list and a method or apparatus may contain additional blocks or elements.

According to an embodiment, a device comprises: a printed circuit board comprising electrical components; a housing of the device, wherein the housing substantially encloses the printed circuit board; a thermal conductive material coated on the printed circuit board, wherein the thermal conductive material is configured to coat an interface between an electrical component and the printed circuit board, and wherein the thermal conductive material is located between the printed circuit board and a portion of the housing according to both a three dimensional topography of the printed circuit board and a three dimensional shape of the portion of the housing.

Alternatively or in addition to the above, the thermal conductive material occupies a whole space between the printed circuit board and the portion of the housing in a direction of z-axis. Alternatively or in addition to the above, when installed, the thermal conductive material is in a fluid, a semi-fluid, a gel or a paste like state when flowingly configured between the printed circuit board and the portion of the housing. Alternatively or in addition to the above, the three dimensional topography is based on a height, a width and a length of electrical components being positioned on the printed circuit board. Alternatively or in addition to the above, the thermal conductive material has different thicknesses on different portions of the printed circuit board. Alternatively or in addition to the above, further including at least one portion of the printed circuit board, which is not covered by the thermal conductive material. Alternatively or in addition to the above, further including a layer of electrically conductive material on the thermal conductive material. Alternatively or in addition to the above, the layer of electrically conductive material is configured over a whole area of the thermal conductive material. Alternatively or in addition to the above, the thermal conductive material comprises silicon configured to act as a moisture protection. Alternatively or in addition to the above, a layer of the thermal conductive material can be removed at a surface of the printed circuit board. Alternatively or in addition to the above, a new layer of the thermal conductive material is coated on the printed circuit board, after the layer has been removed. Alternatively or in addition to the above, the thermal conductive material is configured on a top and a back of the printed circuit board. Alternatively or in addition to the above, the thermal conductive material is configured on an edge of the printed circuit board. Alternatively or in addition to the above, the thermal conductive material comprises silicon including aluminum oxide particles or aluminum nitride particles. Alternatively or in addition to the above, the thermal conductive material comprises a dielectric.

According to an embodiment, a mobile device comprises: a printed circuit board comprising electrical components; a cover of the mobile device; a thermal conductive material configured on the printed circuit board, wherein the thermal conductive material is configured to coat a shape of an electrical component, which is located on a vertical side of the electrical component, wherein the thermal conductive material is configured between the printed circuit board and a portion of the cover according to both a three dimensional topography of the printed circuit board and a three dimensional shape of the portion of the housing.

According to an embodiment, a method comprises: configuring electrical components on a printed circuit board; and flowingly configuring a thermal conductive material on the electrical components; wherein the thermal conductive material is flowingly configured between the electrical components and a portion of a housing of a device of the printed circuit board according to both a three dimensional topography of the electrical components and a three dimensional shape of the portion of the housing.

Alternatively or in addition to above, further comprising before the step of configuring the thermal conductive material, inserting the printed circuit board in a molding tool; casting or injecting the thermal conductive material on the electrical components; curing the thermal conductive material on the electrical components; and removing the molding tool. Alternatively or in addition to above, further comprising configuring an electrically conductive material on the thermal conductive material. Alternatively or in addition to above, further comprising removing the thermal conductive material from the electric components; repairing the electrical components or replacing the electrical components by new electrical components; and configuring new thermal conductive material on the electrical components or on the new electrical components.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:
1. A device, comprising:
a printed circuit board comprising a plurality of electrical components;
a housing of the device, wherein the housing substantially encloses the printed circuit board; and
a thermal conductive material conformed to selected portions of available space within an interior portion of the housing, wherein the thermal conductive material:
coats at least a top side and a bottom side of the printed circuit board, penetrates and conforms to the selected portions of available space within the interior portion of the housing, including at least some gaps, slots, and openings, avoids at least one portion of the printed circuit board, which is not covered by the thermal conductive material, such that the at least one portion of the printed circuit board is uncoated, maintained open by a molding tool, conforming to a space between at least one of the plurality of electrical components and the printed circuit board, and to a space defined by a three-dimensional topography of the printed circuit board and a three-dimensional shape of the interior portion of the housing while maintaining the at least one uncoated portion of the printed circuit board and the at least one uncoated portion of the interior portion of the housing.

2. The device of claim 1, wherein the thermal conductive material occupies a whole space between the printed circuit board and the interior portion of the housing in a direction of z-axis.

3. The device of claim 1, wherein, upon installation, the thermal conductive material is in at least one of a fluid, a semi-fluid, a gel, or a paste state during coating between the printed circuit board and the portion of the housing.

4. The device of claim 1, wherein the three-dimensional topography is based on a height, a width and a length of electrical components being positioned on the printed circuit board.

5. The device of claim 1, wherein the thermal conductive material has different thicknesses on different portions of the printed circuit board.

6. The device of claim 1, wherein the at least one uncoated portion includes an electrical component comprising at least one of an antenna contact clip, a BTB connector, an AV jacket, or at least one electrical connection pin.

7. The device of claim 1, further including a layer of electrically conductive material for EMI shielding on the thermal conductive material.

8. The device of claim 7, wherein the layer of electrically conductive material for EMI shielding is configured over a whole area of the thermal conductive material.

9. The device of claim 1, wherein the thermal conductive material comprises silicon configured to act as a moisture protection.

10. The device of claim 1, wherein a layer of the thermal conductive material is removable at a surface of the printed circuit board.

11. The device of claim 10, wherein a new layer of the thermal conductive material is coated on the printed circuit board, after the removable layer has been removed.

12. The device of claim 1, wherein the thermal conductive material comprises silicon including aluminum oxide particles or aluminum nitride particles.

13. The device of claim 1, wherein the thermal conductive material comprises a dielectric.

14. A mobile device, comprising:
a printed circuit board comprising a plurality of electrical components;
a cover of the mobile device substantially enclosing the printed circuit board; and a thermal conductive material, that conforms to selected portions of available space within the cover, wherein the thermal conductive material: conforms to the selected portions of the available space between at least one of the plurality of electrical components and the printed circuit board, conforms to a space defined by the printed circuit board and an interior portion of the cover according to both a three-dimensional topography of the printed circuit board and a three-dimensional shape of the interior portion of the cover, and coats a top side and a bottom side of the printed circuit board, while maintaining at least one portion of the printed circuit board and at least one portion of the available space within the interior portion of the cover without the thermal conductive material, the at least one portion of the available space including an electrical component of the plurality of electrical component, the electrical component comprising at least one of an antenna contact clip, a BTB connector, an AV jacket, or at least one electrical connection pin.

15. The mobile device of claim 14, wherein, upon installation, the thermal conductive material is in at least one of a fluid, a semi-fluid, a gel, or a paste state during coating between the printed circuit board, the electrical component, and the portion of the cover.

16. The mobile device of claim 14, wherein the three-dimensional topography is based on a height, a width and a length of the electrical components being positioned on the printed circuit board.

17. The mobile device of claim 14, wherein the thermal conductive material has different thicknesses on different portions of the printed circuit board.

18. The mobile device of claim 14, wherein the thermal conductive material comprises silicon configured to act as a moisture protection.

19. The mobile device of claim 14, wherein the thermal conductive material comprises silicon including aluminum oxide particles or aluminum nitride particles.

20. The mobile device of claim 14, wherein the thermal conductive material comprises a dielectric.

* * * * *